Nov 24, 1953 G. BERGSON 2,660,624

HIGH INPUT IMPEDANCE SEMICONDUCTOR AMPLIFIER

Filed Feb. 24, 1949

INVENTOR
Gustav Bergson
BY H. L. Heuston
ATTORNEY

Patented Nov. 24, 1953

2,660,624

UNITED STATES PATENT OFFICE 2,660,624

HIGH INPUT IMPEDANCE SEMICONDUCTOR AMPLIFIER

Gustav Bergson, Germantown, Pa., assignor to Radio Corporation of America, a corporation of Delaware Application February 24, 1949, Serial No. 78,076

1 Claim. (Cl. 179—171)

This invention relates generally to semi-conductor amplifiers, and particularly relates to a three-electrode semi-conductor amplifier having a high input impedance.

In the past, many attempts have been made to construct an amplifier which does not include a vacuum tube. One of the most recent amplifiers of this type utilizes a three-electrode semi-conductor. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. The input circuit of the amplifier described in the publication referred to above is connected between the emitter electrode and the base electrode while the output circuit is connected between the collector electrode and the base electrode. The base electrode is therefore common to the input and output circuit and may be grounded.

The published circuit of the three-electrode semi-conductor amplifier has an input impedance looking into the emitter electrode which is of the order of 100 to 500 ohms, while the output impedance is of the order of 10,000 ohms or more. Thus, a step-down transformer is normally required between successive stages of a cascade amplifier utilizing transistors. Such a low input impedance is also undesirable when the amplifier obtains its signal from a source having a high impedance.

A bias source is connected between the emitter and base electrodes for biasing them in a relatively conducting polarity, this condition being accompanied by the low input impedance. On the other hand, the output impedance is high because the output signal is derived between the collector and base electrodes, which are biased by another voltage source in a relatively non-conducting polarity.

It is the principal object of the present invention, therefore, to provide a semi-conductor amplifier having a high input impedance looking into the emitter electrode.

Another object of the invention is to provide a multi-stage semi-conductor amplifier where the output impedance of one stage is substantially matched to the input impedance of the succeeding stage.

A further object of the invention is to provide a semi-conductor amplifier having a balanced or push-pull input circuit and an unbalanced or single-ended output circuit.

Still another object of the invention is to provide a novel semi-conductor device including a single body of semi-conducting material for use with a multi-stage amplifier.

A three-electrode semi-conductor amplifier comprises a semi-conducting material provided with a base electrode, an emitter electrode and a collector electrode. The base electrode has a relatively large contact area with the semi-conducting material while the emitter and collector electrodes have a relatively small contact area with the material. The emitter and base electrodes are biased in a relatively conducting polarity while the collector and base electrodes are biased in a relatively non-conducting polarity. The input circuit is connected to the emitter electrode and the output circuit which includes an impedance element, such as a resistor, is connected effectively between the collector and base electrodes. In accordance with the present invention, a capacitor is connected between an intermediate point on the output resistor and the emitter electrode. This capacitor has a reactance at the frequency of the signal to be amplified which is small compared to the impedance of the input circuit in series with the impedance from the tapped output resistor to ground. In this manner the effective input impedance may be raised considerably.

An amplifier of this type may be used with advantage for cascading several amplifier stages. Since the input impedance looking into the emitter electrode may be made approximately equal to the output impedance at the collector electrode, two or more amplifier stages may be connected without utilizing impedance matching networks. Furthermore, the impedance looking into the emitter electrode may also be made to equal substantially the impedance looking into the base electrode. Accordingly a push-pull or balanced input signal may be impressed on the emitter and base electrodes while an unbalanced output signal may be derived from the collector electrode.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6, 7:
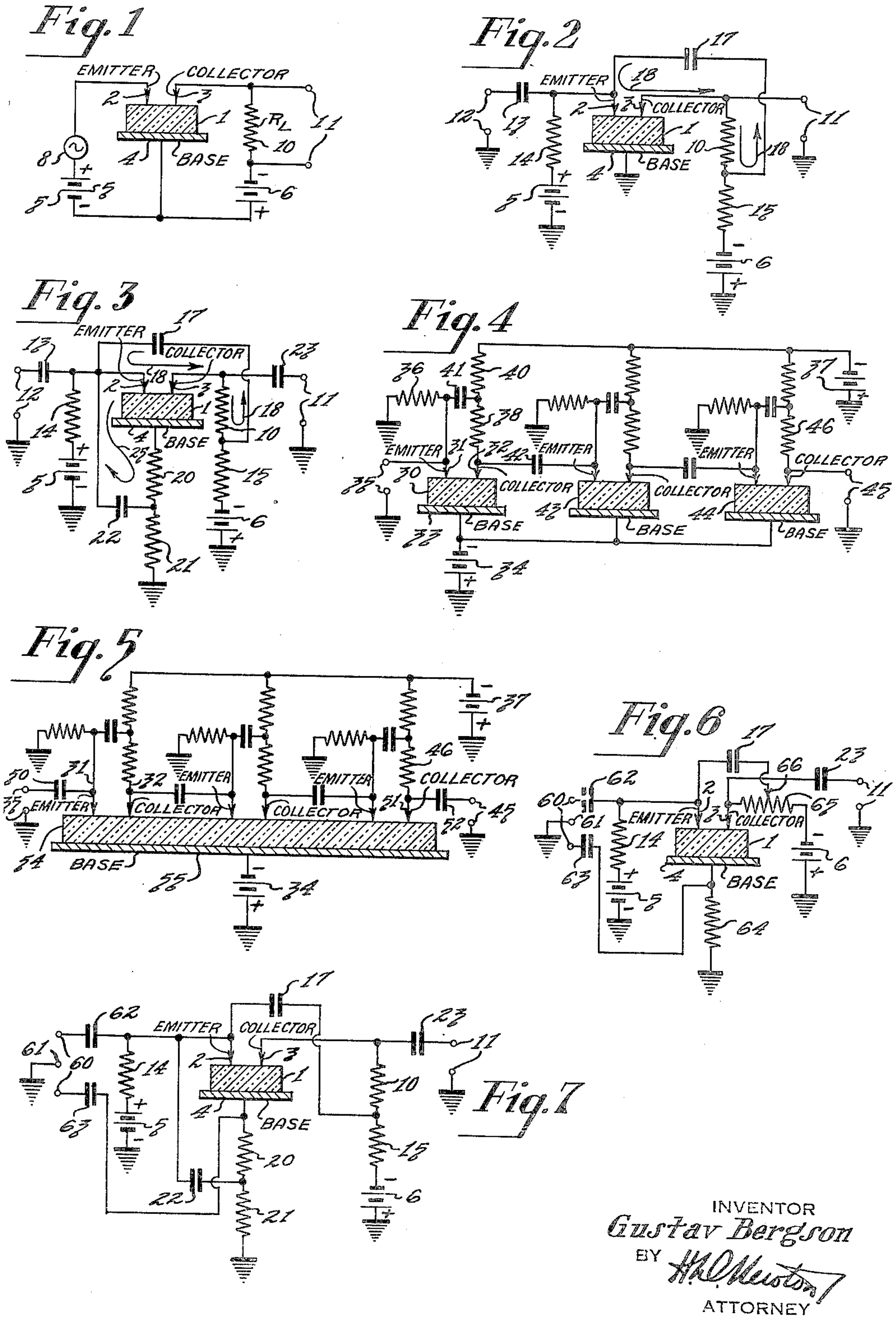
Fig. 1 is a circuit diagram of a known three-electrode semi-conductor amplifier.
Fig. 2 is a circuit diagram of a three-electrode semi-conductor having a high impedance looking into the emitter electrode and embodying the present invention.
Fig. 3 is a circuit diagram of a modified high input impedance semi-conductor amplifier in accordance with the invention.
Fig. 4 is a circuit diagram of a multistage semi-conductor amplifier embodying the present invention.
Fig. 5 is a circuit diagram of a multistage semi-conductor amplifier similar to that of Fig. 4 but utilizing a single body of semi-conducting material in accordance with this invention.
Fig. 6 is a circuit diagram of a semi-conductor amplifier having a balanced input circuit and an unbalanced output circuit in accordance with the invention.
Fig. 7 is a circuit diagram of a modified push-pull input, single-ended output semi-conductor amplifier of the invention.

Referring now to the drawing, in which like components have been designated by the same reference numerals throughout the figures, and particularly to Fig. 1, there is illustrated a previously-known, three-electrode, semi-conductor device arranged as an amplifier. The amplifier of Fig. 1 has been included to explain the theory of operation of a semi-conductor amplifier. The amplifier comprises a block or body 1 of semi-conductor material which may consist, for example, of germanium or silicon containing a small but sufficient number of atomic impurity centers or lattice imperfections, as commonly employed for best results in semi-conductor devices (such as crystal rectifiers). Germanium is the preferred material for block 1 and, as will be further explained below, may be prepared so as to be an electronic N type semi-conductor. The surface of semi-conducting block 1 may be polished and etched in the manner explained in the paper by Bardeen and Brattain referred to. It is also feasible to utilize the germanium block from a commercial high-back-voltage germanium rectifier such as the type 1N34. In this case, further surface treatment may not bt required.

Semi-conductor 1 is provided with three electrodes, viz., emitter electrode 2, collector electrode 3 and base electrode 4 as indicated in Fig. 1. Emitter electrode 2 and collector electrode 3 may be point contacts which may consist, for example, of tungsten or Phosphor-bronze wires having a diameter of the order of 2 to 5 mils. The emitter and collector electrodes 2, 3 are ordinarily placed closely adjacent to each other and may be separated by a distance of from 2 to 10 mils. It is also feasible to arrange emitter and collector electrodes 2, 3 on opposite surfaces of a layer of semi-conducting material 1 which may have a thickness of the order of 5 mils. Base electrode 4 provides a large-area low-resistance contact with the bulk material of semi-conductor 1.

A suitable voltage source such as battery 5 is connected between emitter electrode 2 and base electrode 4 and is of such a polarity as to bias them in a relatively conducting direction or polarity. Accordingly, when the semi-conductor is of the N type, emitter electrode 2 should have a positive potential with respect to base electrode 4 as illustrated. Another voltage source such as battery 6 is provided between collector electrode 3 and base electrode 4 and has such a polarity as to bias them in a relatively non-conducting direction or polarity. Consequently, since an N type semi-conductor is assumed for Fig. 1, collector electrode 3 should have a negative potential with respect to base electrode 4. The source of the input signal indicated at 8 is connected in the emitter lead, that is, between emitter electrode 2 and base electrode 4. The output load $R_L$ indicated by resistor 10 is connected between collector electrode 3 and base electrode 4 and is in series with bias battery 6. The output signal may be derived across load resistor 10 from output terminals 11.

At the present time it is not possible to give a definite theory accounting for all details of the operation of the three-electrode, semi-conductor amplifier. It is believed, however, that the following explanation will be helpful for a better understanding of the present invention. A semi-conductor is a material whose electrical conductivity lies intermediate the conductivity of good conductors and that of good insulators. The materials which have been widely used in crystal rectifiers and which are also used in the three-electrode, semi-conductor amplifier are of crystalline type, preferably consisting of an aggregate of small crystals. Although conduction in some materials may be ionic in nature, where the actual motion of electrically charged atoms represents the flow of current, the present invention is of particular value in connection with those materials in which the atoms remain relatively fixed while conduction takes place by electrons. These latter materials are called electronic semi-conductors. It is appreciated that ionic conductors can also be of use in amplifier devices so that, although the discussion and explanation of operation is confined to electronic semi-conduction of the type found for example in silicon or germanium, the invention is not to be construed as so limited, except as defined in the appended claims.

For some time it has been assumed that there are two types of electronic semi-conductors, one called the N type (negative type) while the other is called the P type (positive type). The N type semi-conductor behaves as if there were present a limited number of free negative charges or electrons which conduct the current somewhat similarly to the manner in which current conduction takes place in a metal. Such material, in a well-ordered crystal lattice, would not be expected to have many free electrons. It is therefore assumed that the free electrons which account for the conduction are donated by impurities or lattice imperfections which may be termed "donors." Thus, in an N type silicon crystal which is a semi-conductor, the donor may consist of small impurities of phosphorus. Since silicon has four valence electrons and phosphorus five, the excess valence electron of the occasional phosphorus atom is not required for the tetrahedral binding to adjacent silicon atoms in the crystal and hence is free to move. The current in an N type semi-conductor accordingly flows as if carried by negative charges (electrons).

In the P type of semi-conductor, current conduction appears to take place as if the carriers were positive charges. This is believed to be dre to the presence of impurities which will accept an electron from an atom of the semi-conductor. Thus, a P type silicon crystal may contain a few boron atoms which act as "acceptors." Since boron has only three valence electrons, it will accept an electron from a silicon atom to complete the atomic bond. There is, accordingly, a "hole" in the crystalline structure which might be considered a virtual positive charge. Under the influence of an external electrical field the hole or the holes will travel in the direction that a positive charge would travel.

If two contacts are made to an electronic semi-conductor of N or P type, and if these contacts are of similar material and of equal area, an impressed voltage will lead to current flow of about the same magnitude with either polarity of voltage. However, it will ordinarily be found that there is a non-linear relation between current and voltage, as the latter is increased. This non-linear effect was first explained as being a result of the disturbance of the internal electronic energy levels of the crystal lattice due to the metal contact which was said to produce a so-called barrier layer or energy hump. It could be shown that, with an N type crystal, an increasing positive potential on the metal contact caused a change in the barrier-layer energy hump in such a direction as to allow electrons to flow relatively freely into the metal. A metal contact having a negative potential, however, would alter the field so as to repel the internal conduction electrons, and the only current flow would then be due to the escape of electrons from the metal over the energy hump of the barrier layer; this current flow would be quite small. The explanation was sufficient to explain crudely the observed phenomena as well as those with P type material, in which the effects are similar with the opposite polarity of metal contact. Although as indicated, there is a hypothetical rectification effect at the contact to either N or P type material, the two equal contacts will cancel out this effect and the current flow is independent of polarity and relatively small.

In the actual two-electrode rectifier (crystal diode), one contact is made to the bulk crystal and is of such large area that its resistance is extremely low for either direction of current flow. Thus, non-linear effects at this large-area contact are not of great significance compared with those at the second contact, which is of very small area, such as that of a wire having a sharp point. In this way, the hypothetical barrier layer at the crystal surface near the small-area contact can cause actual rectification. As already indicated, such an unequal contact area device made of an N type semi-conductor will conduct readily when the small area contact is positive in polarity and is relatively non-conducting when the small area contact is negative. For a two-electrode rectifier made of a P type material the situation is reversed.

In the semi-conductor amplifier of three-electrodes, one large-area contact is made to the bulk crystal and two smaller-area contacts are made close to one another on a crystal surface. There are now two possible barrier layers but, even more important, it is believed that current may now flow from one small-area contact to the other one in a way requiring a much more complete explanation of the barrier-layer effect than the one involving only the presence of the metal contact. This will be discussed below in connection with N type material but it is to be understood that analogous effects may occur with P type material by appropriate reversal of potentials just as in the rectifier case.

The recently discovered amplifying properties of the three-electrode semi-conductor may be explained by extending the above theory as follows: Let it be assumed that the germanium or silicon crystal used in the device is an N type semi-conductor throughout its bulk. However, it is now believed that a very thin surface layer of the crystal, closely related to the so-called barrier-layer effect mentioned above, may behave like a P type semi-conductor. This thin layer of P type, that is, "hole" conduction, may be caused by a chemical or physical difference in the behavior of the impurities on the surface of the crystal, or it may be caused by a change in the energy levels of the surface atoms due to the discontinuity of the crystal structure at the surface. In any case, an excess of holes is created in this surface layer of the semi-conductor.

Even in the rectifier, the new hypothesis is of value since the original one without the assumption of the P layer failed to explain the lack of difference in rectification between high and low work function metal contacts and also led to predictions of a higher resistance in the conducting direction of rectifiers than was actually observed. The previous explanation of rectifiers has now been modified by assuming the presence of this surface P layer on the crystal and furthermore it now seems possible that the rectifying barrier layer exists near the surface region at the P to N boundary. Thus, differences of the work functions of metallic points play a negligible role in the rectification, and the relatively larger barrier area now assumed accounts for the low resistance of the crystal in the conducting direction. Furthermore, it is now believed that conduction near the point contact is of the "hole" or virtual positive charge type, while inside the crystal it is of the electron, or negative charge type. For the three-electrode semi-conductor amplifier, under discussion, this new theory is very important since the amplifier behavior is chiefly governed by the "hole" current on the surface of the crystal between the two point contacts.

Because the point contact 2 (of Fig. 1) known as the emitter electrode is biased positive with respect to the crystal 1, conduction readily takes place through the barrier layer to base electrode 4, with "holes" or virtual positive charges moving in the surface layer of the crystal while electrons carry the current in the interior of the crystal. However, since a nearby collector point contact or electrode 3 at a negative potential will cause an electric surface field and attract the positive "holes," the "holes" will not only flow into or through the crystal barrier layer but may also flow directly from emitter electrode 2 to collector electrode 3 along the surface. The collector electrode barrier layer would normally prevent current unless these "holes" are provided by the emitter. Changing the voltage between emitter electrode 2 and the bulk crystal 1 will increase or decrease the emitter current available for flow in the P type surface layer to the collector electrode 3.

Fig. 2 illustrates a high input impedance semi-conductor amplifier in accordance with the invention. The input signal may be impressed on input terminals 12, one of which is grounded while the other one is coupled to emitter electrode 2 through coupling capacitor 13. Bias battery 5 may be connected to emitter electrode 2 through resistor 14. Resistor 14 and the impedance of the source (represented by input terminals 12) in shunt have a degenerative effect on the operation of the amplifier. Base electrode 4 may be grounded as shown. Collector electrode 3 is connected to bias battery 6 through load resistor 10 and resistor 15 connected in series. The output signal may be derived from output terminals 11.

In accordance with the present invention, capacitor 17 is connected between the junction point of resistors 10 and 15 and emitter electrode 2. Capacitor 17 is provided for the purpose of increasing the input impedance of the amplifier. Without the provision of capacitor 17, the alternating signal current would flow from collector electrode 3 through resistors 10, 15, battery 6 and ground, battery 5, resistor 14, the last two in shunt with the source impedance, and emitter electrode 2. This current flowing through the input circuit takes power from the input signal and therefore reduces the effective input impedance. In accordance with the present invention, a path is provided for the alternating signal current through resistor 10, capacitor 17, emitter electrode 2 and collector electrode 3. The current path has been indicated by arrows 18. Since, in the circuit of the present invention, this alternating current cannot flow through the input circuit, the input impedance is raised, and may be made to equal substantially the output impedance of the amplifier.

The reactance of capacitor 17 should be small at the signal frequency compared to the combined impedance of resistor 15 in series with the impedance of resistor 14 in parallel with the source impedance. The resistance of resistor 15 should be of the order of the input impedance of the amplifier.

The circuit of Fig. 3 is a modification of that of Fig. 2. It includes capacitor 17 which is provided for the same purpose as in the amplifier of Fig. 2. However, the amplifier of Fig. 3 is further provided with resistors 20 and 21 connected in series between base electrode 4 and ground. Capacitor 22 is provided between the junction point of resistors 20, 21 and emitter electrode 2. Coupling capacitor 23 may be provided between collector electrode 3 and output terminals 11.

Capacitor 22 again provides a path for the alternating signal current indicated by arrow 25. Thus the alternating current which would normally flow from emitter electrode 2 to base electrode 4, resistors 20, 21, ground, battery 5 and resistor 14 in shunt with the source impedance, is now provided with a path through capacitor 22 as indicated by arrow 25. Accordingly, the input impedance can again be maintained high in spite of the fact that an impedance element is provided in the base lead.

The capacitance of capacitor 22 should be small at the signal frequency compared to the combined resistance of resistor 21 in series with the impedance of resistor 14 in parallel with the source impedance. The resistance of resistor 21 should be of the order of the input impedance. It is to be understood that capacitor 17 may be omitted in the circuit of Fig. 3.

Fig. 4 illustrates a three-stage semi-conductor amplifier, each stage being similar to the amplifier circuit of Fig. 2. The first amplifier stage comprises semi-conductor 30 provided with emitter electrode 31, collector electrode 32 and base electrode 33. Base electrode 33 is connected to ground through bias battery 34. The input signal may be impressed on input terminals 35, one of which is grounded while the other one is connected to emitter electrode 31. Emitter electrode 31 is connected to ground through resistor 36. It will be understood that resistor 36 functions as a bias resistor because a direct current will flow from ground through resistor 36, emitter electrode 31, base electrode 33 and battery 34 back to ground and from ground through resistor 36, emitter electrode 31, collector electrode 32, resistors 38 and 40 and battery 37 to ground. The potential between emitter electrode 31 and base electrode 33 should be such as to bias them in a relatively conducting polarity. Assuming a semi-conducting material 30 consisting of N type germanium, emitter electrode 31 should normally have a positive bias with respect to base electrode 33. Such a bias is obtained with the circuit of Fig. 4.

Collector electrode 32 is connected to bias battery 37 through load resistor 38 and resistor 40 connected in series. Capacitor 41 is provided between the junction point of resistors 38, 40 and emitter electrode 31.

It will be seen that amplifier stage 30 is essentially like the amplifier circuit of Fig. 2 with the exception that the bias battery 34 is provided between base electrode 33 and ground instead of being arranged in the emitter lead as shown in Fig. 2.

An amplified signal may accordingly be derived across load resistor 38 and may be coupled through coupling capacitor 42 to the emitter electrode of the succeeding amplifier stage 43 which is identical with the first amplifier stage 30. The last amplifier stage 44 is also identical with the previous amplifier stages, and the amplified output signal may be derived from output terminals 45 connected effectively across output load resistor 46. Bias batteries 34 and 37 may be common to the three amplifier stages as illustrated. The manner of operation of the three-stage amplifier of Fig. 4 will now be evident so that no further explanation is deemed necessary.

The three-stage amplifier of Fig. 5 has substantially the same circuit as that of Fig. 4. The input signal may be impressed upon input terminals 35, one of which is coupled to emitter electrode 31 through coupling capacitor 50. The amplified output signal may be obtained from output terminals 45, one of which may be coupled to the last collector electrode 51 through coupling capacitor 52. It is of course to be understood that coupling capacitors 50 and 52 may also be provided in the circuit of Fig. 4.

The amplifier of Fig. 5 differs essentially from that of Fig. 4 in view of the fact that a single body 54 of semi-conducting material is provided for all three amplifier stages. Semi-conductor 54 is provided with a single base electrode 55. Another surface of the semi-conductor 54 is provided with pairs of associated collector and emitter electrodes such as emitter electrode 31 and collector electrode 32. It is to be understood that more than three pairs of associated emitter and collector electrodes may be provided on a single body of semi-conducting material in accordance with the present invention. The operation of the three-stage amplifier of Fig. 5 is the same as that of the amplifier of Fig. 4.

Referring now to Fig. 6, there is illustrated a semi-conductor amplifier having a balanced or push-pull input circuit and an unbalanced or single-ended output circuit. A push-pull input signal may be impressed on input terminals 60 which are balanced with respect to terminal 61 connected to ground. By means of coupling capacitors 62, 63 input terminals 60 are coupled to emitter electrode 2 and base electrode 4 respectively. Battery 5 and resistor 14 are connected in series between ground and emitter electrode 2. Resistor 64 is connected between base electrode 4 and ground to provide an input impedance. The output signal may be derived across output resistor 65 connected between battery 6 and collector electrode 3. Coupling capacitor 17 is connected between emitter electrode 2 and variable tap 66 on output resistor 65. Instead of providing a variable tap 66, capacitor 17 may also be connected to the junction point of two individual, series-connected resistors which may replace resistor 65. An output signal which is unbalanced with respect to ground may be obtained from output terminals 11, one of which is grounded, while the other one is coupled through capacitor 23 to collector electrode 3.

Capacitor 17 is provided for the same purpose as the capacitor 17 of Fig. 2, that is, to raise the input impedance looking into emitter electrode 2. The impedance of emitter electrode 2 may be raised to such an extent that it becomes substantially equal to the impedance looking into base electrode 4. Accordingly, a push-pull input signal may be impressed on emitter electrode 2 and on base electrode 4 in accordance with the invention.

The balanced-input, unbalanced-output amplifier of Fig. 7 is similar to the circuit of Fig. 6. Resistors 20 and 21 are connected in series between base electrode 4 and ground. The junction point of resistors 20, 21 is coupled to emitter electrode 2 through capacitor 22. Furthermore, capacitor 17 is connected between emitter electrode 2 and the junction point of resistors 10, 15 connected serially between collector electrode 3 and bias battery 6. A balanced input signal is impressed upon input terminals 60 coupled to emitter electrode 2 and base electrode 4 through coupling capacitors 62 and 63 respectively. The unbalanced output signal is derived from output terminals 11 connected effectively across load resistor 10. The operation of semi-conductor amplifier of Fig. 7 will be evident in view of the above explanations.

There has thus been disclosed a semi-conductor amplifier having a high input impedance looking into the emitter electrode. The input impedance can be made to equal substantially the output impedance and accordingly a multi-stage amplifier may be provided without the necessity of providing impedance matching networks between the successive amplifier stages. Furthermore, the impedance looking into the emitter electrode may be made to equal the impedance looking into the base electrode. The amplifier of the invention may accordingly be utilized for amplifying a push-pull input signal impressed on the emitter and base electrodes. An unbalanced output signal may be derived from the collector electrode. The multi-stage amplifier of the invention may utilize a semi-conductor device including a single body of semi-conducting material provided with a single base electrode and with pairs of associated emitter and collector electrodes.

What is claimed is:

An amplifier comprising a body of semi-conducting material, a base electrode, an emitter electrode and a collector electrode provided on said body, a means for biasing said base and emitter electrodes in a relatively conducting polarity and for biasing said base and collector electrodes in a relatively non-conducting polarity, an input circuit including a first resistor connected between said emitter electrode and a point of fixed potential, an output circuit including a second resistor and a thrid resistor connected in series between said collector electrode and a point of fixed potential, a fourth and a fifth resistor connected in series between said base electrode and said point of fixed potential, a first capacitor connected between the junction point of said second and third resistors and said emitter electrode, said first capacitor providing a feedback path for returning a desired fraction of alternating collector currents to said emitter electrode, said fraction being so selected as to present oscillations, and a second capacitor connected between the junction point of said fourth and fifth resistor and said emitter electrode, said second capacitor providing a feedback path for returning a desired fraction of alternating emitter currents from said base electrode to said emitter electrode, said third resistor having a resistance of the order of the input impedance of said amplifier, and said capacitors having each a reactance at the frequency of a signal to be amplified that is small compared to the combined impedance of said input circuit and of said third resistor connected in series, said capactors providng for an increased effective input impedance.

GUSTAV BERGSON.

References Cited in the file of this patent

UNITED STATES PATENTS

| Number | Name | Date |
|---|---|---|
| 2,131,366 | Black | Sept. 27, 1938 |
| 2,476,323 | Rack | July 19, 1949 |
| 2,486,776 | Barney | Nov. 1, 1949 |
| 2,489,272 | Daniels | Nov. 29, 1949 |
| 2,517,960 | Barney | Aug. 8, 1950 |
| 2,524,035 | Bardeen | Oct. 3, 1950 |
| 2,541,322 | Barney | Feb. 13, 1951 |
| 2,585,078 | Barney | Feb. 12, 1952 |

OTHER REFERENCES

Terman: Radio Engineers Handbook, pub. 1943 by McGraw-Hill Book Co., New York, page 474. (Copy in Div. 51.)